(12) United States Patent
Tauchi

(10) Patent No.: US 10,971,183 B2
(45) Date of Patent: Apr. 6, 2021

(54) DIELECTRIC LAYER, OPTICAL RECORDING MEDIUM, SPUTTERING TARGET AND OXIDE

(71) Applicant: Kobe Steel, Ltd., Kobe (JP)

(72) Inventor: Yuki Tauchi, Kobe (JP)

(73) Assignee: Kobe Steel, Ltd., Kobe (JP)

( * ) Notice: Subject to any disclaimer, the term of this patent is extended or adjusted under 35 U.S.C. 154(b) by 0 days.

(21) Appl. No.: 16/484,365

(22) PCT Filed: Jan. 15, 2018

(86) PCT No.: PCT/JP2018/000793
§ 371 (c)(1),
(2) Date: Aug. 7, 2019

(87) PCT Pub. No.: WO2018/154997
PCT Pub. Date: Aug. 30, 2018

(65) Prior Publication Data
US 2019/0355389 A1 Nov. 21, 2019

(30) Foreign Application Priority Data
Feb. 22, 2017 (JP) .............. JP2017-031367

(51) Int. Cl.
*G11B 7/24* (2013.01)
*G11B 7/2548* (2013.01)
(Continued)

(52) U.S. Cl.
CPC ........ *G11B 7/2548* (2013.01); *C23C 14/3414* (2013.01); *G11B 7/266* (2013.01); *C23C 14/083* (2013.01); *C23C 14/086* (2013.01)

(58) Field of Classification Search
CPC .......... G11B 7/257; G11B 7/2571; G11B 2007/25715; G11B 7/2578; G11B 7/25715; G11B 7/266
See application file for complete search history.

(56) References Cited

U.S. PATENT DOCUMENTS

| 7,407,697 B2 * | 8/2008 | Nishihara | ............. H01L 45/06 428/64.1 |
| 2005/0018593 A1 | 1/2005 | Doi et al. | |

(Continued)

FOREIGN PATENT DOCUMENTS

TW 201728554 A 8/2017

OTHER PUBLICATIONS

Written Opinion of the International Searching Authority dated Apr. 17, 2018 in PCT/JP2018/000793 filed Jan. 15, 2018, citing documents AB-AG therein, 10 pages (with English translation).

*Primary Examiner* — Elizabeth E Mulvaney
(74) *Attorney, Agent, or Firm* — Oblon, McClelland, Maier & Neustadt, L.L.P.

(57) ABSTRACT

A dielectric layer is formed from an oxide containing Sn and at least one of Zn, Zr, Si and Ga. The molar percentages of Sn, Zn, Zr, Si, and Ga, relative to the total elements in the oxide, represented by a, b, c, d, and e, respectively, satisfy the conditions (1)-(7): (1) $0 \leq b/(a+b) \leq 0.6$, (2) $0 \leq (c+d)/(a+b+c+d+e) \leq 0.5$, (3) $0 \leq b \leq 50$, (4) $0 \leq c \leq 40$, (5) $0 \leq d \leq 45$, (6) $0 \leq e \leq 40$, and (7) $20 \leq b+c+d+e \leq 80$. The dielectric layer enables favorable information recording in an oxide-based recording layer on which the dielectric layer is directly overlaid, does not require preventive measures for health hazard, and is superior in durability.

6 Claims, 1 Drawing Sheet

(51) Int. Cl.
*C23C 14/34* (2006.01)
*G11B 7/26* (2006.01)
*C23C 14/08* (2006.01)

(56) References Cited

U.S. PATENT DOCUMENTS

| | | |
|---|---|---|
| 2005/0202204 A1 | 9/2005 | Nishihara et al. |
| 2011/0216643 A1 | 9/2011 | Tauchi et al. |
| 2014/0141259 A1 | 5/2014 | Imran et al. |
| 2015/0064480 A1 | 3/2015 | Imran et al. |
| 2015/0232379 A1 | 8/2015 | Imran et al. |
| 2017/0186984 A1 | 6/2017 | Hosono et al. |
| 2017/0323660 A1 | 11/2017 | Tsuchino et al. |
| 2019/0058142 A1 | 2/2019 | Hosono et al. |

* cited by examiner

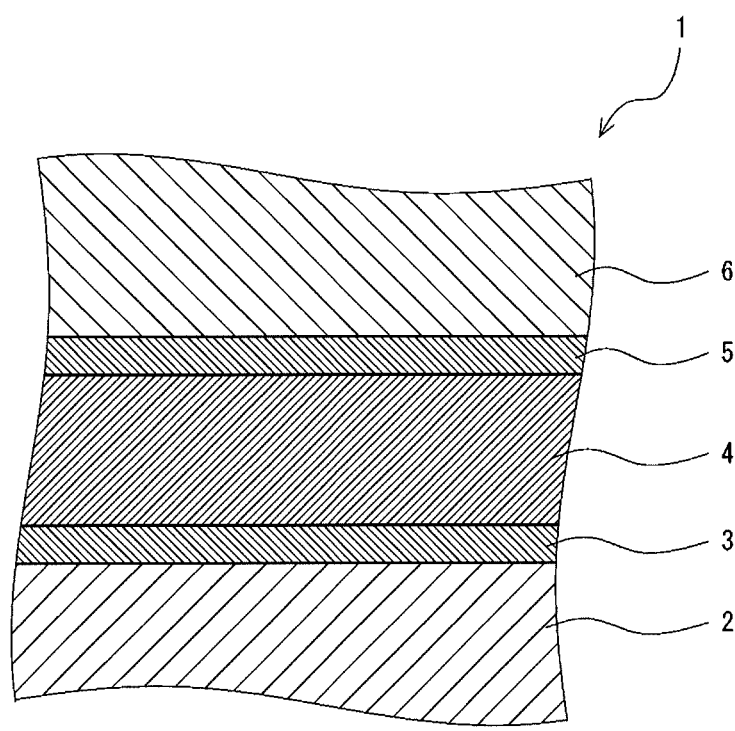

DIELECTRIC LAYER, OPTICAL RECORDING MEDIUM, SPUTTERING TARGET AND OXIDE

TECHNICAL FIELD

The present invention relates to a dielectric layer, an optical recording medium, a sputtering target and an oxide.

BACKGROUND ART

Optical recording media are represented by optical discs such as CDs, DVDs and the like, and classified into three types: read-only, recordable, and rewritable. In addition, as a recording procedure for the optical recording media, phase-change of a component material of the recording layer, an interlayer reaction of multilayered recording layer, decomposition of a component material of the recording layer, and the like have been known. Organic dye materials have been widely used for formation of the recording layer of a recordable optical disc; however, in recent years, enhanced densification of recording has led to use of inorganic materials.

A recordable optical recording medium employing a metal oxide as the inorganic material for the recording layer has been proposed (Patent Document 1). The optical recording medium of Patent Document 1 is of a decomposition type, in which indium oxide and palladium oxide are contained in the recording layer, and the recording layer releases oxygen upon irradiation with laser. In the case of using an oxide in the recording layer, information is recorded through decomposition of the oxide. In order to inhibit time-dependent deterioration of the recording layer or to enhance signal characteristics of the recording layer, overlaying a dielectric layer directly on both faces of the recording layer has been proposed.

Patent Document 1 proposes using indium oxide, indium sulfide, etc. as a material of the dielectric layer of the optical recording medium. An oxide comprising indium ensures electric conductivity of a sputtering target to increase film-forming rate, whereby shortening of the time period of the process is enabled; however, since indium is designated as a specified chemical substance, preventive measures for health hazard are required. On the other hand, the sulfide causes sulfuration in an adjacent layer due to time-dependent alteration, and may therefore impair reliability of the optical recording medium.

In regard to the optical recording medium, there is a demand for improvement of the recording characteristic (power margin) of the recording layer, for enabling support of widely different intensities of recording laser.

PRIOR ART DOCUMENTS

Patent Documents

Patent Document 1: Japanese Unexamined Patent Application, Publication No. 2010-137545

SUMMARY OF THE INVENTION

Problems to be Solved by the Invention

The present invention was made in view of the foregoing circumstances, and an object of the present invention is to provide: a dielectric layer that enables favorable information recording in an oxide-based recording layer on which the dielectric layer is directly overlaid, does not require preventive measures for health hazard, and is superior in durability; an optical recording medium provided with the dielectric layer; a sputtering target for forming the dielectric layer; and an oxide that enables production of the dielectric layer.

Means for Solving the Problems

According to a first aspect of the present invention made for solving the aforementioned problems, a dielectric layer that is to be overlaid directly on a recording layer for recording carried out by irradiation with light: is formed from an oxide comprising: a Sn element; and at least one of a Zn element, a Zr element, a Si element and a Ga element, and satisfies the following inequalities (1) to (7), given a content of the Sn element being a mol %, a content of the Zn element being b mol %, a content of the Zr element being c mol %, a content of the Si element being d mol %, and a content of the Ga element being e mol %, with respect to a total of elements other than oxygen in the oxide:

$$0 \leq b/(a+b) \leq 0.6 \quad (1)$$

$$0 \leq (c+d)/(a+b+c+d+e) \leq 0.5 \quad (2)$$

$$0 \leq b \leq 50 \quad (3)$$

$$0 \leq c \leq 40 \quad (4)$$

$$0 \leq d \leq 45 \quad (5)$$

$$0 \leq e \leq 40 \quad (6)$$

$$20 \leq b+c+d+e \leq 80 \quad (7).$$

Due to the dielectric layer being formed from an oxide comprising: a Sn element; and at least one of a Zn element, a Zr element, a Si element and a Ga element, and satisfying the inequalities (1) to (7), favorable information recording is enabled in an oxide-based recording layer on which the dielectric layer is directly overlaid. In addition, due to not containing an In element, the dielectric layer does not require preventive measures for health hazard. Furthermore, due to the aforementioned constitution, the dielectric layer is superior in resistance to deterioration.

It is preferred that a volume resistivity of the dielectric layer is less than or equal to 10 MΩ·cm. When the volume resistivity falls within the above range, the dielectric layer enables static charge of the optical recording medium to be prevented and defects caused by adhesion of particles in the air to be inhibited. It is to be noted that the term "volume resistivity" as referred to means a value measured pursuant to JIS-C2139 (2008).

According to a second aspect of the present invention made for solving the aforementioned problems, an optical recording medium comprises a recording layer for recording carried out by irradiation with light, and the dielectric layer of the first aspect that is overlaid directly on the recording layer.

The optical recording medium enables favorable information recording in the oxide-based recording layer as described above, and does not require preventive measures for health hazard since the dielectric layer does not contain an In element. In addition, the optical recording medium is superior in durability even after time-dependent deterioration.

According to a third aspect of the present invention made for solving the aforementioned problems, a sputtering target for use in formation of a dielectric layer that is to be overlaid directly on a recording layer for recording carried out by irradiation with light has a constitution comprising: a Sn element; and at least one of a Zn element, a Zr element, a Si element and a Ga element, and the sputtering target satisfies the following inequalities (1) to (7), given a content of the Sn element being a mol %, a content of the Zn element being b mol %, a content of the Zr element being c mol %, a content of the Si element being d mol %, and a content of the Ga element being e mol %, with respect to a total of elements in the constitution:

$$0 \leq b/(a+b) \leq 0.6 \tag{1}$$

$$0 \leq (c+d)/(a+b+c+d+e) \leq 0.5 \tag{2}$$

$$0 \leq b \leq 50 \tag{3}$$

$$0 \leq c \leq 40 \tag{4}$$

$$0 \leq d \leq 45 \tag{5}$$

$$0 \leq e \leq 40 \tag{6}$$

$$20 \leq b+c+d+e \leq 80 \tag{7}$$

The sputtering target can be used for formation of a dielectric layer by a sputtering procedure.

According to a fourth aspect of the present invention made for solving the aforementioned problems, an oxide comprises: a Sn element; and at least one of a Zn element, a Zr element, a Si element and a Ga element, in which the oxide satisfies the following inequalities (1) to (7), given a content of the Sn element being a mol %, a content of the Zn element being b mol %, a content of the Zr element being c mol %, a content of the Si element being d mol %, and a content of the Ga element being e mol %, with respect to a total of elements other than oxygen:

$$0 \leq b/(a+b) \leq 0.6 \tag{1}$$

$$0 \leq (c+d)/(a+b+c+d+e) \leq 0.5 \tag{2}$$

$$0 \leq b \leq 50 \tag{3}$$

$$0 \leq c \leq 40 \tag{4}$$

$$0 \leq d \leq 45 \tag{5}$$

$$0 \leq e \leq 40 \tag{6}$$

$$20 \leq b+c+d+e \leq 80 \tag{7}$$

The oxide can be used for production of the dielectric layer.

Effects of the Invention

The present invention provides: a dielectric layer that enables favorable information recording in an oxide-based recording layer on which the dielectric layer is directly overlaid, does not require preventive measures for health hazard, and is superior in durability; an optical recording medium provided with the dielectric layer; a sputtering target for forming the dielectric layer; and an oxide that enables production of the dielectric layer.

BRIEF DESCRIPTION OF THE DRAWINGS

FIG. 1 is a partially enlarged schematic cross-sectional view showing an optical recording medium of an embodiment of the present invention.

DESCRIPTION OF EMBODIMENTS

Embodiments of the dielectric layer, the optical recording medium, the sputtering target and the oxide of the present invention will be described in detail hereafter, with reference to the drawings.

Optical Recording Medium

An optical recording medium 1 illustrated in FIG. 1 is an optical disc having a structure in which a substrate 2, a dielectric layer 3, a recording layer 4, a dielectric layer 5 and a light-transmissive protective layer 6 are laminated in this order. The optical recording medium 1 is provided with the recording layer 4 for recording carried out by irradiation with light, and the dielectric layer 3 and the dielectric layer 5 that are respectively overlaid directly on both sides of the recording layer 4. It is to be noted that the optical recording medium 1 may be configured to be compatible to the standard of, for example, a well-known high-capacity optical disc, i.e., a Blu-ray (registered trademark) disc, but is not particularly limited. In addition, the optical recording medium 1 is not limited to the one provided with only one recording layer 4, and may also be the one provided with two or more recording layers, and respective dielectric layers between: a substrate and the recording layer; the two or more recording layers; and the recording layer and a light-transmissive protective layer.

Substrate

The substrate 2 constitutes one face of the optical recording medium 1, and prevents damages to a face of the recording layer 4 directed to the substrate 2. As a material for the substrate 2, for example, polycarbonate, an acrylic resin, or the like may be used. The substrate 2 may be formed by, without limitation thereto, injection molding, for example.

Dielectric Layer

The dielectric layer 3 has functions of: preventing oxygen, which is released upon decomposition of the oxygen in the recording layer 4, from escaping from the recording layer 4; maintaining durability of the recording layer 4; and adjusting an amount of transmitted light.

The dielectric layer 3 is overlaid directly on the recording layer 4 for recording carried out by irradiation with light, and is formed from an oxide comprising: a Sn element; and at least one of a Zn element, a Zr element, a Si element and a Ga element. The dielectric layer 3 may be formed by, without limitation thereto, a sputtering procedure.

The lower limit of the volume resistivity of the dielectric layer 3 is preferably as low as possible, and for example, preferably 0.01 MΩ·cm, more preferably 0.05 MΩ·cm, and still more preferably 0.1 MΩ·cm. Meanwhile, the upper limit of the volume resistivity of the dielectric layer 3 is preferably 10 MΩ·cm, more preferably 7 MΩ·cm, and still more preferably 5 MΩ·cm. When the volume resistivity falls within the above range, the dielectric layer 3 is enabled to have a sufficient function of preventing static charge, and consequently enables static charge of the optical recording medium 1 to be prevented and defects caused by adhesion of particles in the air to be inhibited.

Oxide

The oxide forming the dielectric layer 3 has a constitution satisfying the following inequalities (1) to (7), given a content of the Sn element being a mol %, a content of the Zn element being b mol %, a content of the Zr element being c mol %, a content of the Si element being d mol %, and a content of the Ga element being e mol %, with respect to a total of elements other than oxygen:

$$0 \leq b/(a+b) \leq 0.6 \tag{1}$$

$$0 \leq (c+d)/(a+b+c+d+e) \leq 0.5 \tag{2}$$

$$0 \leq b \leq 50 \quad (3)$$

$$0 \leq c \leq 40 \quad (4)$$

$$0 \leq d \leq 45 \quad (5)$$

$$0 \leq e \leq 40 \quad (6)$$

$$20 \leq b+c+d+e \leq 80 \quad (7).$$

The Sn element serves to provide the dielectric layer with an oxygen barrier function that prevents decomposition of the recording layer. The lower limit of the content of the Sn element with respect to a total of elements other than oxygen in the oxide is preferably 20 mol %, more preferably 30 mol %, and still more preferably 40 mol %. Meanwhile, the upper limit of the content of the Sn element is preferably 80 mol %, more preferably 75 mol %, and still more preferably 70 mol %.

The Zn (zinc) element is added to the dielectric layer together with Sn, and serves to inhibit variation in a shape or size of a recording mark formed on the recording layer, to thereby reduce jitter. The lower limit of the content of the Zn element with respect to a total of elements other than oxygen in the oxide is preferably 0 mol %, more preferably 20 mol %, and still more preferably 30 mol %. Meanwhile, the upper limit of the content of the Zn element is preferably 55 mol %, more preferably 50 mol %, and still more preferably 45 mol %.

The Zr (zirconium) element serves to improve the oxygen barrier function of the dielectric layer, to thereby inhibit deterioration of a recording signal in the recording layer. The lower limit of the content of the Zr element with respect to a total of elements other than oxygen in the oxide is preferably 0 mol %, more preferably 5 mol %, and still more preferably 10 mol %. Meanwhile, the upper limit of the content of the Zr element is preferably 40 mol %, more preferably 35 mol %, and still more preferably 30 mol %.

The Si (silicon) element serves to improve the oxygen barrier function of the dielectric layer, to thereby inhibit deterioration of a recording signal in the recording layer. The lower limit of the content of the Si element with respect to a total of elements other than oxygen in the oxide is preferably 0 mol %, more preferably 10 mol %, and still more preferably 20 mol %. Meanwhile, the upper limit of the content of the Si element is preferably 45 mol %, more preferably 40 mol %, and still more preferably 35 mol %.

The Ga (gallium) element serves to improve the oxygen barrier function of the dielectric layer, to thereby inhibit deterioration of a recording signal in the recording layer. The lower limit of the content of the Ga element with respect to a total of elements other than oxygen in the oxide is preferably 0 mol %, more preferably 5 mol %, and still more preferably 10 mol %. Meanwhile, the upper limit of the content of the Ga element is preferably 40 mol %, more preferably 35 mol %, and still more preferably 30 mol %.

The lower limit of the total content of the Zn, Zr, Si and Ga elements with respect to a total of elements other than oxygen in the oxide is preferably 20 mol %, more preferably 25 mol %, and still more preferably 30 mol %. Meanwhile, the upper limit of the total content of the Zn, Zr, Si and Ga elements is preferably 80 mol %, more preferably 75 mol %, and still more preferably 70 mol %.

The lower limit of a value of $b/(a+b)$ is preferably 0, more preferably 0.1, and still more preferably 0.2. Meanwhile, the upper limit of the value of $b/(a+b)$ is preferably 0.6, more preferably 0.5, and still more preferably 0.4.

The lower limit of a value of $(c+d)/(a+b+c+d+e)$ is preferably 0, more preferably 0.05, and still more preferably 0.1. Meanwhile, the upper limit of the value of $(c+d)/(a+b+c+d+e)$ is preferably 0.5, more preferably 0.45, and still more preferably 0.4.

The total content of the Sn, Zn, Zr, Si and Ga elements with respect to a total of elements other than oxygen in the oxide is preferably greater than or equal to 95 mol %, more preferably greater than or equal to 98 mol %, and still more preferably 100 mol %. As a remainder, inevitable impurities such as an In (indium) element is accepted to be comprised. However, since the In element is designated as the specified chemical substance as described above, it is preferred that the oxide does not comprise the In element.

When the respective contents of the Sn element, the Zn element, the Zr element, the Si element and the Ga element fall within the above ranges, the dielectric layer 3 can be formed that enables favorable information recording in the recording layer 4 and does not require preventive measures for health hazard. In addition, the dielectric layer is enabled to have the oxygen barrier function, and to have appropriately adjusted light transmittance and durability.

It is to be noted that the dielectric layer 5 is constituted similarly to the dielectric layer 3; however, the constitution of the oxide forming the dielectric layer 5 may be either the same as, or different from, the oxide forming the dielectric layer 3.

Recording Layer

The recording layer 4 is formed from the oxide, and permits information recording through decomposition of the oxide upon irradiation with the recording laser. The oxide for forming the recording layer 4 may be an oxide of Mn, Zn, Sn, Cu, Pd, Ag, Bi, or the like. The recording layer 4 may be formed by, without limitation thereto, a sputtering procedure.

Light-Transmissive Protective Layer

The light-transmissive protective layer 6 is a protective material constituting another face of the optical recording medium 1, and prevents damages to a face of the recording layer 4 directed to the light-transmissive protective layer 6. A highly light-transmissive and hard material is used for forming the light-transmissive protective layer 6. Such a material may be polycarbonate, an acrylic resin, or the like. The light-transmissive protective layer 6 may be formed by, without limitation thereto, a spin-coating procedure. In the case of forming the light-transmissive protective layer 6 by the spin-coating procedure, the material for the light-transmissive protective layer 6 is preferably an ultraviolet ray-curable resin.

Production Method of Optical Recording Medium

The optical recording medium 1 may be obtained by a production method including steps of, for example: providing the substrate 2; overlaying the dielectric layer 3 on one face of the substrate 2; overlaying the recording layer 4 on an exposed face of the dielectric layer 3; overlaying the dielectric layer 5 on an exposed face of the recording layer 4; and overlaying the light-transmissive protective layer 6 on an exposed face of the dielectric layer 5.

Substrate-Providing Step

In the substrate-providing step, the substrate 2 is formed from a material such as polycarbonate, an acrylic resin or the like, by injection molding, for example. The substrate 2 may be in any shape as long as the dielectric layer 3 can be formed on one face thereof, for example a disc-like shape.

First Dielectric Layer-Overlaying Step

In the first dielectric layer-overlaying step, the dielectric layer 3 is formed on one face of the substrate 2 by a well-known sputtering procedure. The sputtering procedure involves use of the following sputtering target and an oxygen-containing atmosphere.

Sputtering Target

The sputtering target is for use in formation of the dielectric layer that is to be overlaid directly on the recording layer for recording carried out by irradiation with light, has a constitution comprising: a Sn element; and at least one of a Zn element, a Zr element, a Si element and a Ga element, and satisfies the following inequalities (1) to (7), given a content of the Sn element being a mol %, a content of the Zn element being b mol %, a content of the Zr element being c mol %, a content of the Si element being d mol %, and a content of the Ga element being e mol %, with respect to a total of elements in the constitution:

$$0 \leq b/(a+b) \leq 0.6 \quad (1)$$

$$0 \leq (c+d)/(a+b+c+d+e) \leq 0.5 \quad (2)$$

$$0 \leq b \leq 50 \quad (3)$$

$$0 \leq c \leq 40 \quad (4)$$

$$0 \leq d \leq 45 \quad (5)$$

$$0 \leq e \leq 40 \quad (6)$$

$$20 \leq b+c+d+e \leq 80 \quad (7).$$

The inequalities (1) to (7) are as explained for the oxide for the dielectric layer 3, except that the sputtering target is not an oxide. Therefore, explanation thereof is omitted. It is to be noted that the oxide containing the aforementioned elements may be used as the sputtering target.

Recording Layer-Overlaying Step

In the recording layer-overlaying step, the recording layer 4 is formed on an exposed face of the dielectric layer 3 by the well-known sputtering procedure. The sputtering procedure involves use of a sputtering target containing Mn, Zn, Sn, Cu, Pd, Ag, Bi or the like, and an oxygen-containing atmosphere.

Second Dielectric Layer-Overlaying Step

In the second dielectric layer-overlaying step, the dielectric layer 5 is formed on an exposed face of the recording layer 4 by the well-known sputtering procedure. The second dielectric layer-overlaying step is similar to the first dielectric layer-overlaying step, and the sputtering procedure involves use of the aforementioned sputtering target and an oxygen-containing atmosphere. It is to be noted that the constitution of the sputtering target used in the first dielectric layer-overlaying step may be different from the constitution of the sputtering target used in the second dielectric layer-overlaying step.

Light-Transmissive Protective Layer-Overlaying Step

In the light-transmissive protective layer-overlaying step, the light-transmissive protective layer 6 is formed on an exposed face of the dielectric layer 5 by a well-known spin-coating procedure. An acrylic ultraviolet ray-curable resin or the like may be used for forming the light-transmissive protective layer 6.

EXAMPLES

Hereinafter, the embodiments of the present invention will be explained in more detail by way of Examples; however, the present invention is not limited to these Examples.

A disc-shaped substrate made of polycarbonate was provided which was about 120 mm in diameter and about 1.1 mm in thickness, with guide grooves formed on a surface at a track pitch of about 0.32 μm.

Next, a dielectric layer of 10 nm in thickness was formed on the surface of the substrate by a sputtering procedure. The sputtering involved use of a sputtering target formed from complex oxides, and an atmosphere of a mixture of argon and oxygen in a ratio of 10:1 at about 0.3 Pa. Proportions of elements with respect to a total of elements other than oxygen in the dielectric layer thus formed are shown in Table 1.

Subsequently, a recording layer of 40 nm in thickness was formed on the dielectric layer by a sputtering procedure. The sputtering involved use of a sputtering target containing a Zn element, a Cu element and a Mn element, and an atmosphere of a mixture of argon and oxygen in a ratio of 1:1 at about 0.3 Pa. In the recording layer thus formed, the content of a Zn element was 20 mol %, the content of a Cu element was 20 mol %, and the content of a Mn element was 30 mol %, with respect to the total of elements.

Furthermore, a dielectric layer of 10 nm in thickness was formed on the recording layer by a sputtering procedure. The conditions for the sputtering were the same as those for formation of the aforementioned dielectric layer.

Finally, an acrylic ultraviolet ray-curable resin was applied on the dielectric layer by a spin-coating procedure and then cured by irradiation with ultraviolet ray to form a light-transmissive protective layer of about 0.1 mm in thickness.

A jitter value was measured on an optical disc (optical recording medium) thus obtained. An optical disc evaluation device ODU-1000 (available from Pulstec Industrial Co., Ltd.) was used for the measuring of the jitter value. In the measurement, a central wavelength of the recording laser was 405 nm, and a lens having NA (numerical apertures) of 0.85 was used. The jitter value of the optical disc was obtained by: recording random signals on the optical disc according to the Blu-ray (registered trademark) standard, under conditions involving a linear velocity of 4.92 m/s and a standard clock of 66 MHz; and calculating a standard deviation of errors from the standard clock of the recorded signals.

Next, the jitter values were obtained with varying laser intensity, and a laser intensity that gives the smallest jitter value, and a width of a laser intensity that gives a jitter value of less than or equal to 8.5% were measured. Then, the width of the laser intensity that gives the jitter value of less than or equal to 8.5% was divided by the laser intensity that gives the smallest jitter value, whereby a power margin for the laser intensity that gives a bottom jitter was obtained. The power margins and the smallest jitter values (jitter value prior to accelerated aging test) obtained in the measurement are shown in Table 1. It is to be noted that the optical disc No. 18 is an Example without a dielectric layer.

Furthermore, an accelerated aging test was conducted on the optical disc under conditions involving a temperature of 80° C., a relative humidity of 85%, and a retention time of 96 hrs. After the accelerated aging test, the jitter values were measured with varying laser intensity, and the smallest jitter value was obtained. The jitter values (jitter values after accelerated aging test) thus obtained are shown in Table 1. It is to be noted that no measurement was made on the optical disc No. 18.

Moreover, a volume resistivity was measured on a dielectric film having the same constitution as the dielectric layer of the optical disc. The dielectric film used for the measurement of the volume resistivity was formed on a glass substrate by a sputtering procedure, such that a thickness was from 50 nm to 100 nm. The measurement of the volume resistivity was made pursuant to the test method defined in JIS-K6911 (2006), using a high performance resistivity meter Hiresta-UX MCP-HT450 (available from Mitsubishi Chemical Analytech Co., Ltd.). The volume resistivity thus measured is shown in Table 1. It is to be noted that no measurement was made on the optical discs No. 17 and No. 18.

Among the optical discs exhibiting the power margin of greater than or equal to 40%, the jitter value prior to the accelerated aging test of less than or equal to 6.5%, and the jitter value after the accelerated aging test of less than or equal to 7%, the optical discs having the volume resistivity of less than or equal to 10 MΩ·cm were evaluated as "A", while the optical discs having the volume resistivity of greater than 10 MΩ·cm were evaluated as "B". Meanwhile, the optical discs exhibiting the power margin, the jitter value prior to the accelerated aging test, or the jitter value after the accelerated aging test falling outside the above ranges were evaluated as "C".

TABLE 1

| | Proportion of element (mol %) | | | | | | Power | Jitter value (%) | | Volume | |
| | | | | | | | | Prior to accelerated | After accelerated | resistivity | |
| No. | Sn | Zn | Zr | Si | Ga | In | margin | aging test | aging test | (MΩ · cm) | Evaluation |
|---|---|---|---|---|---|---|---|---|---|---|---|
| 1 | 70 | 30 | 0 | 0 | 0 | 0 | 43% | 5.5 | 6.4 | 4.03 | A |
| 2 | 50 | 50 | 0 | 0 | 0 | 0 | 45% | 5.5 | 6.7 | 0.457 | A |
| 3 | 75 | 0 | 0 | 25 | 0 | 0 | 42% | 6.2 | 6.8 | 2.44 | A |
| 4 | 47.5 | 47.5 | 5 | 0 | 0 | 0 | 42% | 5.7 | 6.0 | 27.9 | B |
| 5 | 40 | 40 | 0 | 0 | 20 | 0 | 46% | 5.8 | 6.2 | 215 | B |
| 6 | 56 | 24 | 20 | 0 | 0 | 0 | 46% | 5.7 | 6.3 | >1000 | B |
| 7 | 50 | 20 | 30 | 0 | 0 | 0 | 46% | 5.9 | 6.3 | >1000 | B |
| 8 | 40 | 40 | 20 | 0 | 0 | 0 | 43% | 5.8 | 6.1 | >1000 | B |
| 9 | 40 | 40 | 0 | 20 | 0 | 0 | 44% | 5.8 | 6.5 | >1000 | B |
| 10 | 30 | 30 | 0 | 40 | 0 | 0 | 44% | 6.0 | 6.9 | >1000 | B |
| 11 | 30 | 30 | 20 | 20 | 0 | 0 | 44% | 5.65 | 6.25 | >1000 | B |
| 12 | 25 | 25 | 20 | 30 | 0 | 0 | 48% | 5.93 | 6.1 | >1000 | B |
| 13 | 20 | 80 | 0 | 0 | 0 | 0 | 43% | 5.3 | 10.5 | 35.8 | C |
| 14 | 40 | 60 | 0 | 0 | 0 | 0 | 43% | 5.5 | 9.3 | 26.9 | C |
| 15 | 50 | 0 | 0 | 50 | 0 | 0 | 41% | 6.6 | 10.4 | 5.53 | C |
| 16 | 0 | 100 | 0 | 0 | 0 | 0 | 37% | 6.6 | 7.8 | >1000 | C |
| 17 | 9 | 0 | 0 | 0 | 0 | 91 | 38% | 5.9 | 7.0 | — | C |
| 18 | 0 | 0 | 0 | 0 | 0 | 0 | 32% | 7.1 | — | — | C |

As shown in Table 1, it was proven that the optical discs No. 1 to No. 12 were superior in the power margin, the jitter value prior to the accelerated aging test, and the jitter value after the accelerated aging test. In particular, it was proven that the optical discs No. 1 to No. 3 had the volume resistivity of less than or equal to 10 MΩ·cm.

The optical disc No. 13 was an Example with a content of a Zn element being 80 mol %. The optical disc No. 14 was an Example with a content of a Zn element being 60 mol %. The optical disc No. 15 was an Example with a content of a Si element being 50 mol %. The optical disc No. 16 was an Example with a content of a Zn element being 100 mol % and no Sn element. The optical disc No. 17 was an Example with a content of an In element being 91 mol % and a content of a Sn element being 9 mol %. The optical disc No. 18 was an Example without a dielectric layer.

It was proven that, in regard to the optical discs No. 16 to No. 18, the power margin was less than 40% and the recording characteristic of the recording layer was insufficient. It was proven that, in regard to the optical discs No. 15, No. 16 and No. 18, the jitter value prior to the accelerated aging test was greater than 6.5% and information recording in the recording layer was not favorable. It was proven that, in regard to the optical discs No. 13 to No. 17, the jitter value after the accelerated aging test was greater than 7% and durability was insufficient.

INDUSTRIAL APPLICABILITY

The dielectric layer and the optical recording medium provided with the dielectric layer according to the present invention enable favorable information recording in an oxide-based recording layer on which the dielectric layer is directly overlaid, do not require preventive measures for health hazard, and are superior in durability. In addition, the sputtering target and the oxide according to the present invention enable formation of the dielectric layer.

EXPLANATION OF THE REFERENCE SYMBOLS

1 Optical recording medium
2 Substrate
3 Dielectric layer
4 Recording layer
5 Dielectric layer
6 Light-transmissive protective layer

The invention claimed is:
1. A dielectric layer for directly overlaying on a recording layer for recording carried out by irradiation with light, wherein
the dielectric layer is formed from an oxide consisting of a Sn element and at least one element selected from the group consisting of a Zn element, a Zr element, a Si element and a Ga element, and
the dielectric layer satisfies the following conditions (1) to (7), wherein a content of the Sn element is a mol %, a content of the Zn element is b mol %, a content of the Zr element is c mol %, a content of the Si element is d mol %, and a content of the Ga element is e mol %, with respect to a total of elements other than oxygen in the oxide:

$$0 \leq b/(a+b) \leq 0.6 \quad (1),$$

$$0 \leq (c+d)/(a+b+c+d+e) \leq 0.5 \quad (2),$$

$$0 \leq b \leq 50 \quad (3),$$

$$0 \leq c \leq 40 \quad (4),$$

$$0 \leq d \leq 45 \quad (5),$$

$$0 \leq e \leq 40 \quad (6), \text{ and}$$

$$20 \leq b+c+d+e \leq 80 \quad (7).$$

2. The dielectric layer according to claim 1, wherein a volume resistivity of the dielectric layer is less than or equal to 10 MΩ·cm.

3. An optical recording medium, comprising:
a recording layer for recording carried out by irradiation with light, and
the dielectric layer according to claim 1 that is overlaid directly on the recording layer.

4. A sputtering target for forming a dielectric layer for directly overlaying on a recording layer for recording carried out by irradiation with light,
wherein the sputtering target consists of a Sn element and at least one element selected from the group consisting of a Zn element, a Zr element, a Si element and a Ga element,
wherein the sputtering target satisfies the following conditions (1) to (7), wherein a content of the Sn element is a mol %, a content of the Zn element is b mol %, a content of the Zr element is c mol %, a content of the Si element is d mol %, and a content of the Ga element is e mol %, with respect to a total of elements in the sputtering target:

$$0 \leq b/(a+b) \leq 0.6 \quad (1),$$

$$0 \leq (c+d)/(a+b+c+d+e) \leq 0.5 \quad (2),$$

$$0 \leq b \leq 50 \quad (3),$$

$$0 \leq c \leq 40 \quad (4),$$

$$0 \leq d \leq 45 \quad (5),$$

$$0 \leq e \leq 40 \quad (6), \text{ and}$$

$$20 \leq b+c+d+e \leq 80 \quad (7).$$

5. An oxide, consisting of:
a Sn element; and
at least one element selected from the group consisting of a Zn element, a Zr element, a Si element and a Ga element,
wherein the oxide satisfies the following conditions (1) to (7), wherein a content of the Sn element is a mol %, a content of the Zn element is b mol %, a content of the Zr element is c mol %, a content of the Si element is d mol %, and a content of the Ga element is e mol %, with respect to a total of elements other than oxygen:

$$0 \leq b/(a+b) \leq 0.6 \quad (1),$$

$$0 \leq (c+d)/(a+b+c+d+e) \leq 0.5 \quad (2),$$

$$0 \leq b \leq 50 \quad (3),$$

$$0 \leq c \leq 40 \quad (4),$$

$$0 \leq d \leq 45 \quad (5),$$

$$0 \leq e \leq 40 \quad (6), \text{ and}$$

$$20 \leq b+c+d+e \leq 80 \quad (7).$$

6. An optical recording medium, comprising:
a recording layer for recording carried out by irradiation with light, and
the dielectric layer of claim 2 that is overlaid directly on the recording layer.

* * * * *